(12) United States Patent
Krause et al.

(10) Patent No.: US 10,778,121 B2
(45) Date of Patent: Sep. 15, 2020

(54) ACTIVE COOLING FOR A CONCENTRATED PHOTOVOLTAIC CELL

(71) Applicant: Saint-Augustin Canada Electric Inc., Saint-Augustin de Desmaures (CA)

(72) Inventors: Rainer Krause, Mainz-Kostheim (DE); Bruno Ghyselen, Seyssinet (FR)

(73) Assignee: Saint-Augustin Canada Electric Inc., Saint-Augustin de Desmaures (CA)

( * ) Notice: Subject to any disclaimer, the term of this patent is extended or adjusted under 35 U.S.C. 154(b) by 0 days.

(21) Appl. No.: 15/897,957

(22) Filed: Feb. 15, 2018

(65) Prior Publication Data

US 2018/0183359 A1 Jun. 28, 2018

Related U.S. Application Data

(63) Continuation of application No. 14/233,685, filed as application No. PCT/IB2012/001415 on Jul. 20, 2012, now Pat. No. 10,014,803.

(30) Foreign Application Priority Data

Jul. 26, 2011 (FR) .................................... 11 56837

(51) Int. Cl.
*H02N 11/00* (2006.01)
*H01L 31/052* (2014.01)
(Continued)

(52) U.S. Cl.
CPC ............ *H02N 11/002* (2013.01); *H01F 41/14* (2013.01); *H01L 31/052* (2013.01); *H01L 37/04* (2013.01);
(Continued)

(58) Field of Classification Search
CPC ......... H01L 31/052–0525; H01L 31/04–0443; H01L 37/04; H01L 31/024; H01L 31/03928; H01L 31/0521; H01L 31/058; H01L 31/0583; H01L 31/0406; H02S 40/32; H02S 10/10–30; H02S 40/40–44; H02S 99/00
USPC ....... 310/306, 307, 311, 313 R, 314, 316.03, 310/318, 321, 322, 323.01, 323.06, 310/323.11, 323.03, 328, 334, 345, 367, 310/800, 21; 136/243–265, 200–240
See application file for complete search history.

(56) References Cited

U.S. PATENT DOCUMENTS

| | | |
|---|---|---|
| 3,697,688 A | 10/1972 | Busch et al. |
| 5,743,095 A | 4/1998 | Gschneidner et al. |

(Continued)

FOREIGN PATENT DOCUMENTS

| | | |
|---|---|---|
| CN | 101647127 A | 2/2010 |
| CN | 101647128 A | 2/2010 |

(Continued)

OTHER PUBLICATIONS

Notice of Final Rejection in Korean Patent Application No. 10-2014-7005092 dated Sep. 28, 2018, (7 pages) with Translation.
(Continued)

*Primary Examiner* — Eric R Smith
(74) *Attorney, Agent, or Firm* — TraskBritt

(57) ABSTRACT

A wasted heat harvesting device for harvesting electricity including switching means configured to convey a magnetic field from a first region to at least a second region when the temperature of the switching means crosses a predetermined temperature.

18 Claims, 12 Drawing Sheets

1B

(51) Int. Cl.
*H01L 37/04* (2006.01)
*H02S 40/44* (2014.01)
*H01F 41/14* (2006.01)

(52) U.S. Cl.
CPC .............. *H02S 40/44* (2014.12); *Y02E 10/50* (2013.01); *Y10T 29/4902* (2015.01)

(56) References Cited

U.S. PATENT DOCUMENTS

| | | |
|---|---|---|
| 8,420,926 B1 | 4/2013 | Reedy et al. |
| 8,901,802 B1 | 12/2014 | Que |
| 2003/0011458 A1 | 1/2003 | Nuytkens et al. |
| 2004/0142106 A1 | 7/2004 | Mirkin et al. |
| 2005/0062360 A1 | 3/2005 | Yabuta |
| 2007/0251569 A1 | 11/2007 | Shan et al. |
| 2008/0014661 A1 | 1/2008 | Haag et al. |
| 2008/0122398 A1 | 5/2008 | Ho et al. |
| 2009/0126922 A1 | 5/2009 | Vetrovec |
| 2009/0315335 A1 | 12/2009 | Ujihara et al. |
| 2010/0075261 A1 | 3/2010 | Clevenger et al. |
| 2010/0109474 A1 | 5/2010 | Russberg et al. |
| 2010/0279454 A1 | 11/2010 | Eickelmann et al. |
| 2010/0297800 A1 | 11/2010 | Hovel et al. |
| 2011/0006614 A1 | 1/2011 | Baird et al. |
| 2011/0100412 A1 | 5/2011 | Clevenger et al. |
| 2011/0100413 A1 | 5/2011 | Clevenger et al. |
| 2011/0109165 A1 | 5/2011 | Hahn et al. |
| 2011/0120519 A1 | 5/2011 | Clevenger et al. |
| 2011/0124135 A1 | 5/2011 | Clevenger et al. |
| 2011/0130982 A1 | 6/2011 | Haag et al. |
| 2011/0204721 A1 | 8/2011 | Dahlgren et al. |
| 2011/0317324 A1 | 12/2011 | Clevenger et al. |
| 2012/0179283 A1 | 7/2012 | Krause |
| 2014/0144486 A1 | 5/2014 | Krause et al. |

FOREIGN PATENT DOCUMENTS

| | | |
|---|---|---|
| CN | 101919078 A1 | 12/2010 |
| DE | 102007052784 A1 | 5/2009 |
| JP | 07-107764 A | 4/1995 |
| TW | 200937645 A | 9/2009 |
| WO | 2008116792 A1 | 10/2008 |
| WO | 2010034641 A1 | 4/2010 |

OTHER PUBLICATIONS

Chinese First Office Action for Chinese Application No. 2012/80037186, dated Nov. 3, 2015, 12 pages.
Chinese First Search for Chinese Application No. 2012/80037186, dated Oct. 26, 2015, 2 pages.
Chinese Second Office Action for Chinese Application No. 2012/80037186, dated Jun. 24, 2016, 12 pages.
Chinese Third Office Action for Chinese Application No. 2012/80037186, dated Mar. 2, 2017, 19 pages.
Chinese 4th Office Action for Chinese Application No. 201280037186.7 dated Sep. 5, 2017, 3 pages.
Chinese Supplementary Search for Chinese Application No. 2012/80037186, dated Jun. 15, 2016, 2 pages.
International Preliminary Report on Patentability for International Application No. PCT/IB2012/001415 dated Jan. 28, 2014, 6 pages.
International Search Report for International Application No. PCT/IB2012/001415 dated Oct. 2, 1012, 4 pages.
International Written Opinion for International Application No. PCT/IB2012/001415 dated Oct. 2, 1012, 5 pages.
Solomon, Design of a Thermomagnetic Generator, Energy Conversion and Management, Elsevier Science Publishers, Oxford, GB, vol. 31, No. 2, Jan. 1, 1991, pp. 157-173.
Chinese 5th Office Action for Chinese Application No. 201280037186.7 dated Jan. 29, 2018, (7 pages) with Translation.
Notification of Reason for Refusal in Korean Patent Application No. 10-2014-7005092 dated Feb. 9, 2018, (16 pages) with Translation.
Korean Notice of Preliminary Rejection for Korean Application No. 10-2019-7010681 dated May 31, 2019, 54 pages.
Korean Notice of Final Rejection for Korean Application No. 10-2014-7005092, dated Feb. 8, 2019, 8 pages with English Translation.
Korean Grant of Patent for Korean Application No. 10-2019-7010681, dated Dec. 30, 2019, 2 pages with English Translation.
Korean Notice of Final Rejection for Korean Application No. 10-2019-7010681, dated Oct. 30, 2019, 6 pages with English Translation.
German Office Action for German Application No. 11 2012 003 118.0 dated May 22, 2020, 10 pages.

ACTIVE COOLING FOR A CONCENTRATED PHOTOVOLTAIC CELL

CROSS-REFERENCE TO RELATED APPLICATIONS

This application is a continuation of U.S. patent application Ser. No. 14/233,685, filed Jan. 17, 2014, now U.S. Pat. No. 10,014,803, issued Jul. 3, 2018, which was a national phase entry under 35 U.S.C. § 371 of International Patent Application PCT/IB2012/001415, filed Jul. 20, 2012, designating the United States of America and published in English as International Patent Publication WO 2013/014511 A1 on Jan. 31, 2013, which claims the benefit under Article 8 of the Patent Cooperation Treaty and under 35 U.S.C. § 119(e) to French Patent Application Serial No. 1156837, filed Jul. 26, 2011, the disclosure of each of which is hereby incorporated herein in its entirety by this reference.

BACKGROUND

In recent years, the development of renewable energy has increased due to concern over the availability of fossil energy sources as well as environmental concerns. Among the different kinds of renewable energy sources, solar energy is the most abundant. Accordingly, there has been intensive research on how to collect solar energy and transform it into electricity. Among the different techniques proposed, photovoltaic (PV) cells are well known in the art and have been extensively developed in order to increase their efficiency and lower their cost.

In particular, concentrated photovoltaic (CPV) cells are known to be cheaper to manufacture than a standard photovoltaic type system providing the same amount of power. This is due to the fact that concentrated photovoltaic cells use lenses to focus the solar light on a PV surface, which is smaller due to the light concentration. Accordingly, the area and material required is reduced.

At high concentration ratios of the solar light, for instance, more than 500 times, cooling of the photovoltaic cell is required. This is due to the fact that PV cells are less efficient at higher temperatures and due to the possibility of the PV cells being damaged by very high temperatures.

In order to cool down the PV cells, passive cooling, such as a heat dissipater, becomes complicated and, therefore, costly. As an alternative, it is known to use an active cooling solution in which some medium, like water or oil, is used for cooling down the cell. In this approach, the cooling medium is heated and either directly used, for instance, as hot water, or used to run a generator for electricity production. In the latter case, the efficiency of the electricity generation process is rather low.

More specifically, a typical CPV cell can be sized between 0.25 cm$^2$ and 1 cm$^2$. Assuming a concentration ratio of 500, it can be estimated that about 5 to 18 watts are wasted in heat. This is roughly on the same order of magnitude of the energy transformed into electricity by the CPV cell.

DISCLOSURE

Accordingly, it would be an improvement in the art of concentrated photovoltaic cells if the generated heat could be transformed into electricity via a highly efficient process.

Such a problem is solved by the invention, as defined by the independent claims.

More specifically, the present invention may relate to a wasted heat harvesting device for harvesting electricity including: switching means configured to convey a magnetic field from a first region to at least a second region when the temperature of the switching means crosses a predetermined temperature.

As a result of such approach, a wasted heat harvesting device is capable of converting heat into electricity in an efficient manner.

In some embodiments, the wasted heat harvesting device can further include: magnetic means configured to generate the magnetic field; a magnetic flux conveyor configured to convey a magnetic flux generated by the switching of the switching means; and electricity-generating means configured to generate electricity from the magnetic flux.

This approach results in a wasted heat harvesting device capable of converting heat into electricity with a simple design.

In some embodiments, a first side of the magnetic flux conveyor can be connected to one pole of the magnetic means and the switching means can be placed between a second side of the magnetic flux conveyor and the other pole of the magnetic means.

With this approach, the magnetic field can generate a magnetic flux flowing through the magnetic flux conveyor.

In some embodiments, the switching means can be a magnetic alloy switch.

As a result of this approach, the switch can allow or prevent passage of the magnetic field.

In some embodiments, the electricity-generating means can include a coil wound around the magnetic flux conveyor.

As a result of this approach, electricity can be generated from the magnetic flux.

In some embodiments, the magnetic flux conveyor can be any of iron type, ferromagnetic alloy, such as Fe or Fe—P or FeSi or Ni/Fe 45/55.

With this approach, the magnetic flux can be conveyed efficiently.

In some embodiments, the magnetic means can be any of SmCo$_5$, Sm$_2$Co$_{15}$, Nd$_2$Fe$_{14}$B or Ba ferritis.

As a result of this approach, the magnetic field can be efficiently realized.

In some embodiments, the switching means can be made of Gd$_5$(Si$_x$Ge$_{1-x}$)$_4$.

As a result of such approach, the switching of the magnetic flux can be realized in an efficient manner.

The present invention may further relate to a wasted heat harvesting system including: at least two wasted heat harvesting devices according to any of the previous embodiments, each of the at least two wasted heat harvesting devices including a device power output for outputting electricity generated by the electricity-generating means.

With this approach, multiple wasted heat harvesting devices can operate in conjunction.

In some embodiments, the at least two device power outputs can be connected in parallel or in series to each other.

As a result of this approach, multiple wasted heat harvesting devices operating at the same frequency can operate in conjunction.

In some embodiments, the connection of the at least two device power outputs can be connected to an AC/DC converter and the output of the AC/DC converter can be connected to a power output of the wasted heat harvesting system.

With this approach, the power output of the wasted heat harvesting system can be connected to a second power output of a similar wasted heat harvesting system.

In some embodiments, the connection of the at least two device power outputs can be connected to an AC/AC converter and the output of the AC/AC converter can be connected to a power output of the wasted heat harvesting system.

As a result of such approach, the power output of the wasted heat harvesting system can be connected to a second power output of a similar wasted heat harvesting system.

In some embodiments, each of the at least two device power outputs can be connected to an AC/DC converter.

With this approach, multiple wasted heat harvesting devices not operating at the same frequency can operate in conjunction.

In some embodiments, the output of the AC/DC converters can be connected in series or in parallel to each other and the resulting connection can be connected to a power output of the wasted heat harvesting system.

This approach results with multiple wasted heat harvesting devices not operating at the same frequency being able to operate in conjunction.

In some embodiments, each of the at least two device power outputs can be connected to an AC/AC converter.

With this approach, multiple wasted heat harvesting devices not operating at the same frequency can operate in conjunction.

In some embodiments, the output of the AC/AC converters can be connected in series or in parallel to each other and the resulting connection can be connected to a power output of the wasted heat harvesting system.

As a result of such approach, multiple wasted heat harvesting devices not operating at the same frequency can operate in conjunction.

The present invention may further relate to a modular wasted heat harvesting system comprising at least two wasted heat harvesting systems according to any of the previous embodiments.

The present invention may further relate to a photovoltaic cell including a wasted heat harvesting device and/or a wasted heat harvesting system and/or a modular wasted heat harvesting system according to any of the previous embodiments.

As a result of this approach, heat generated by sunlight on the photovoltaic cell can be efficiently converted into electricity.

The present invention may further relate to a solar module comprising a plurality of photovoltaic solar cells, in particular, concentrated photovoltaic solar cells, further comprising at least one wasted heat harvesting device configured to transform heat into electricity configured and arranged such that at least one of the photovoltaic solar cells is furthermore cooled by the transformation of heat into electricity.

This approach results in the solar module being able to efficiently operate because of the cooling of the cells and the generated heat additionally being converted into electricity.

The present invention may further relate to a method for realizing a wasted heat harvesting device including the steps of: a first deposition step of depositing a metal layer on a substrate; a second deposition step of depositing a magnetic alloy on the substrate; a third deposition step of depositing a ferromagnetic seed material on the substrate; a fourth deposition step of depositing a metal layer on the substrate; and a fifth deposition step of depositing a magnetic material on the substrate.

As a result of this approach, it is possible to realize a wasted heat harvesting device with a reduced number of steps and with technology compatible with photovoltaic cell manufacturing.

BRIEF DESCRIPTION OF THE DRAWINGS

The invention will be described in more detail, by way of example, hereinafter using advantageous embodiments and with reference to the drawings. The described embodiments are only possible configurations in which the individual features may, however, as described above, be implemented independently of each other or may be omitted. Equal elements illustrated in the drawings are provided with equal reference numerals. Parts of the description related to equal elements illustrated in the different drawings may be left out. In the drawings.

DETAILED DESCRIPTION

Figure 1A:
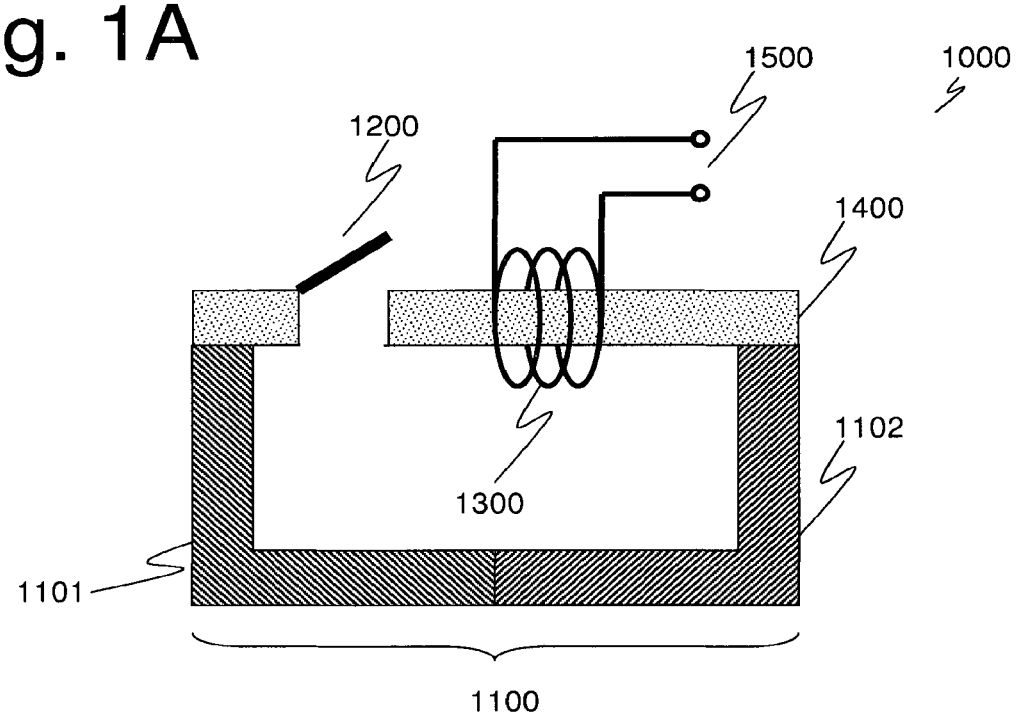
FIG. 1A is a schematic drawing of a wasted heat harvesting device according to an embodiment of the present invention.

As can be seen in FIG. 1A, a wasted heat harvesting device 1000 in accordance with an embodiment of the present invention comprises a magnet 1100 including south pole 1101 and north pole 1102, a ferromagnet 1400, a switch 1200 and a coil 1300. The two ends of the coil 1300 act as a power output 1500 of the wasted heat harvesting device.

Figure 1B:
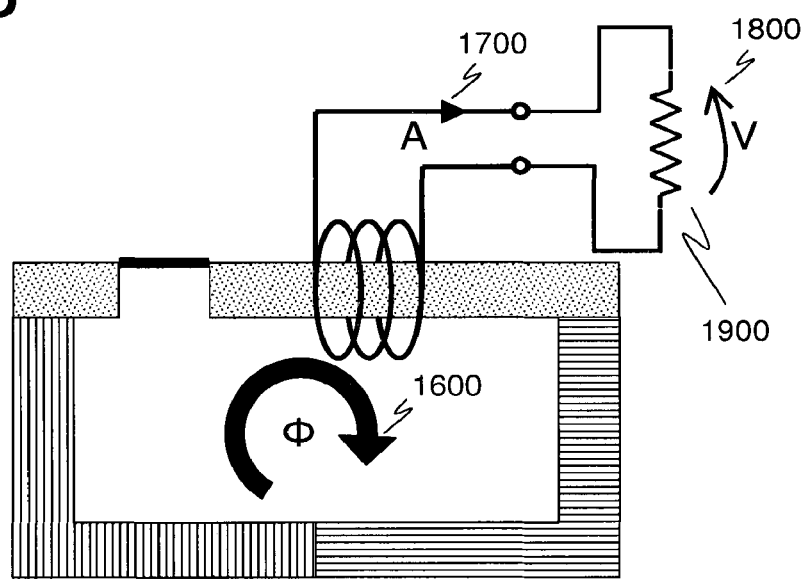
FIG. 1B is a schematic drawing of the operation of the wasted heat harvesting device of FIG. 1A.

As can be seen in FIG. 1B, when the switch 1200 switches from the open position of FIG. 1A to the closed position of FIG. 1B, a magnetic flux Φ 1600 is generated by the magnetic field of magnet 1100 being redirected through the ferromagnet 1400. The magnetic flux 1600 induces a current A 1700 in coil 1300. The current 1700 can be collected at power output 1500, for instance, to power a load 1900 resulting in a voltage drop V 1800.

In other words, the magnetic field is conveyed from a first region outside the coil 1300 to a second region inside the coil 1300 by the switch 1200.

Symmetrically, when the switch moves from the closed position of FIG. 1B to the open position of FIG. 1A, an opposite magnetic flux is generated, resulting in an opposite induced current. Accordingly, by the opening and closing of the switch 1200, an AC current is generated at the power output 1500.

More specifically, the switch 1200 is a magnetic switch alloy that switches on and off depending on its temperature. The wasted heat harvesting device is placed in thermal contact with a CPV cell. When the CPV cell is exposed to sunlight, its temperature will rise. As the temperature rises above a first predefined temperature, the switch 1200 closes. This causes the temperature to drop. As the temperature drops below a second predefined temperature, the switch opens. After a certain time, the CPV cell temperature will start rising again because of solar irradiation and the temperature will increase again, leading to a new cycle.

In this manner, the CPV cell can be cooled actively. That is, thermal energy is converted to electricity in order to cool the cell, instead of passively dissipating the thermal energy.

Although the above embodiment has been described with a first and a second predetermined temperature so as to indicate a hysteresis of the magnetic switch alloy, the present invention is not limited to this. Alternatively, the magnetic switch alloy could have a substantially negligible hysteresis and the first and second predetermined temperatures could substantially correspond to a single threshold temperature.

For instance, the material of the magnetic switch alloy could be $Gd_5(Si_xGe_{1-x})_4$. When using this material, the first and second predetermined switching temperatures can be set, for instance, between 40° C. and 80° C., according to the composition of the switching alloy.

Although the embodiment has been described with reference to a coil 1300 and a ferromagnet 1400, the present invention is not limited to this. Alternatively, the present invention could be realized even without a ferromagnet, but only using a geometry that allows a magnetic field to be at least partially re-directed, or conveyed, from a first region to a second region, based on a change in temperature. The magnetic flux generated by such change can then be converted into electrical energy. The conversion to electrical energy can be done via the coil but also via any other means that allows a magnetic flux to be converted into electricity, such as a straight piece of conductor.

The material and dimensions of the switch 1200 are chosen based on the thermal mass of the CPV cell on which the wasted heat harvesting device 1000 is matched. More specifically, the thermal mass of the heat harvesting device 1000 is matched to the thermal mass of the CPV cell to be cooled. The term "matching" in this context means that, for instance, the heat harvesting device 1000 on the cell backside is, e.g., a 1.5 mm wide ring that is 200 μm thick. In this case, the physical mass of the ferromagnetic material is comparable, i.e., matched, to the mass of the cell.

Figure 2:
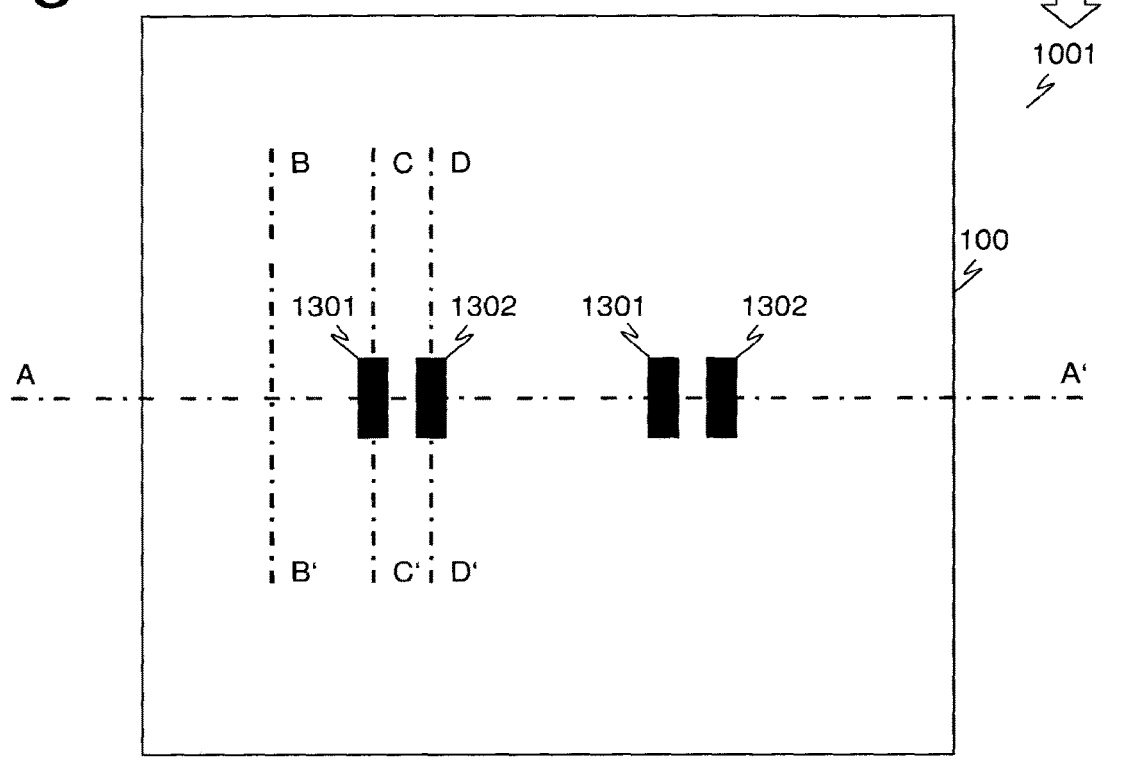
FIGS. 2 to 7 are schematic drawings of a method for realizing a wasted heat harvesting device of FIG. 1A.
Figure 2:
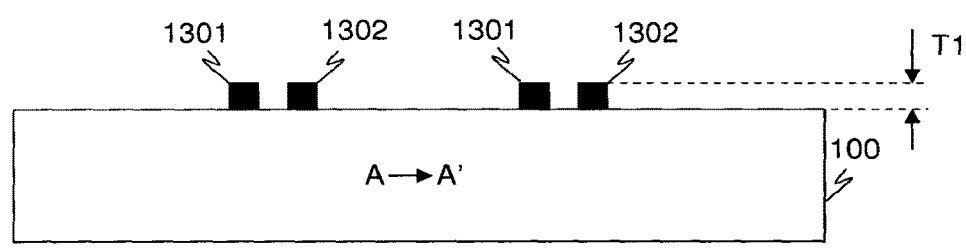
Figure 2:
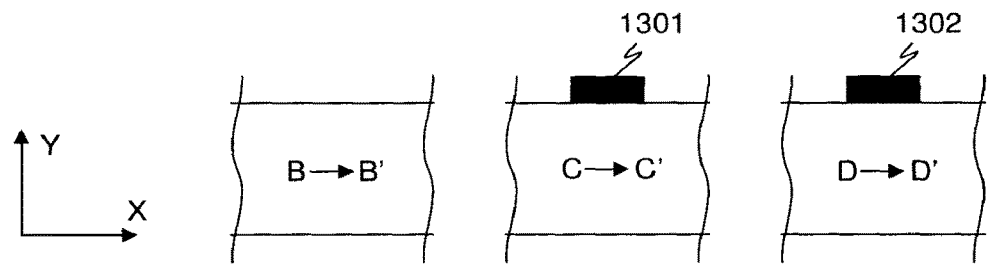

As can be seen in FIG. 2, a process for realizing a wasted heat harvesting device 1000 includes a deposition step S1 of depositing a metal layer on a substrate 100, thereby obtaining intermediate wasted heat harvesting device 1001. The deposition of the metal layer results in first and second coil segments 1301 and 1302, respectively.

More specifically, FIG. 2 represents from top to bottom, a top view of substrate 100, a section view of substrate 100 along the line A-A', and three section views of substrate 100 along the lines B-B', C-C' and D-D'.

As can be seen in the section view along line A-A', the deposited metal layer could have a thickness T1 in the range of 100 μm to 200 μm, with a preferred value of 150 μm. The metal could be any iron-based material or any other material that enables high magnetic flux.

Moreover, in this particular example, the length of the first and second coil segments 1301 and 1302 along direction Y, on the top view, is longer than the length of those elements along direction X. However, the present invention is not limited to this. Alternatively, the dimensions of the first coil segment 1301 and second coil segment 1302 could be different between each other as long as the chosen dimensions allow the realization of a coil.

Figure 3:
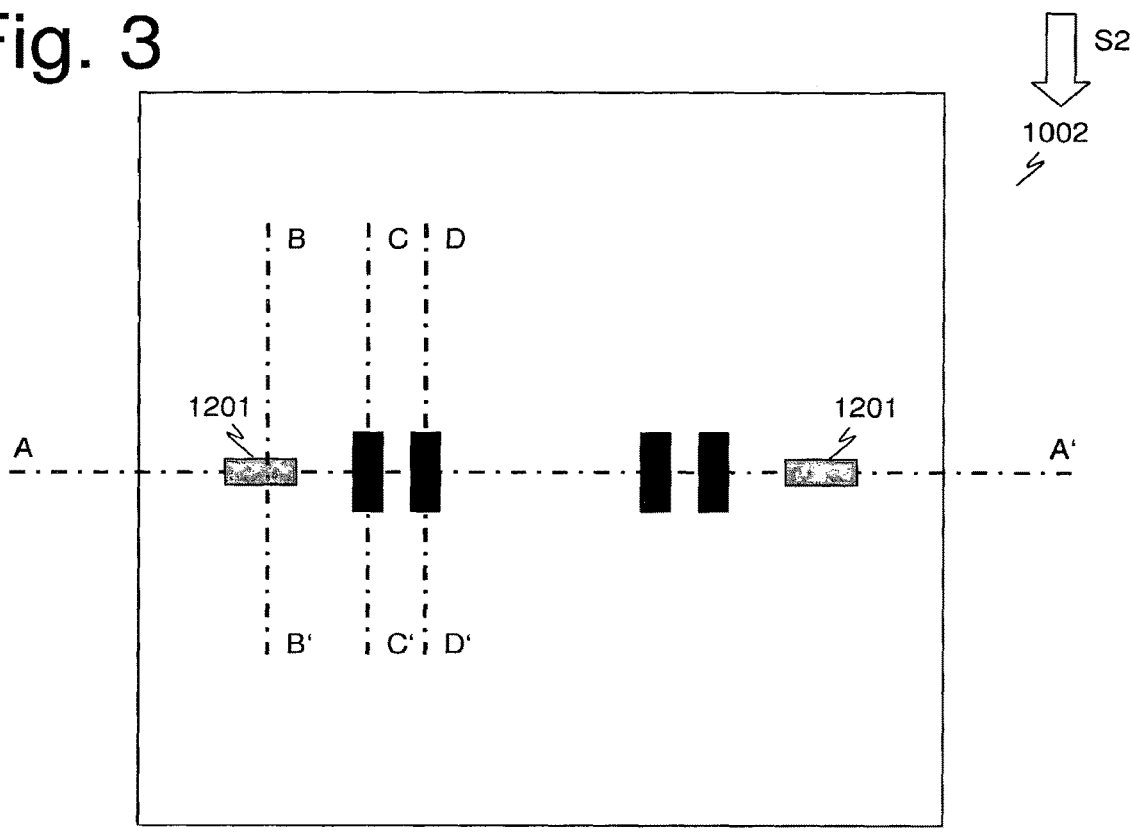
Figure 3:
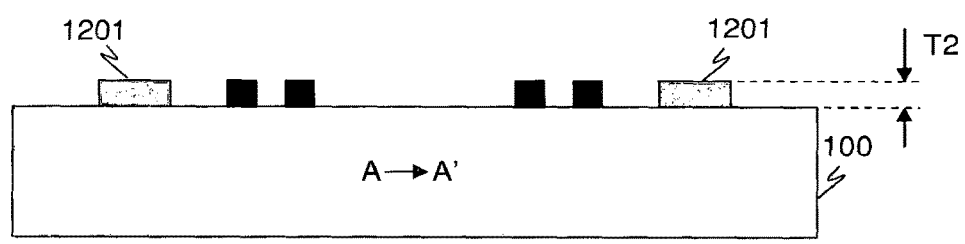
Figure 3:
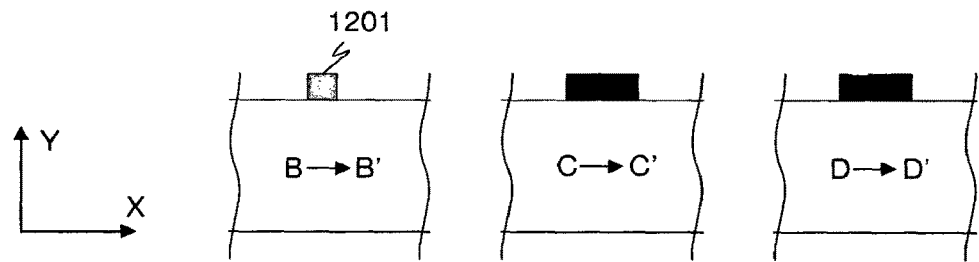

As can be seen in FIG. 3, the process for realizing a wasted heat harvesting device 1000 further includes a deposition step S2 of depositing a magnetic alloy on a substrate 100, thereby obtaining intermediate wasted heat harvesting device 1002. The deposition of the magnetic alloy results in switch 1201.

More specifically, FIG. 3 represents, from top to bottom, a top view of substrate 100, a section view of substrate 100 along the line A-A', and three section views of substrate 100 along the lines B-B', C-C' and D-D'.

As can be seen in the section view along line A-A', the deposited magnetic alloy layer could have a thickness T2 in the range of 100 μm to 300 μm, with a preferred value of 200 μm. The metal could be any of $Gd_5(Si_xGe_{1-x})_4$ as described above or any other thermomagnetic material with the capability of switching the magnetic performance at a defined temperature.

Figure 4:
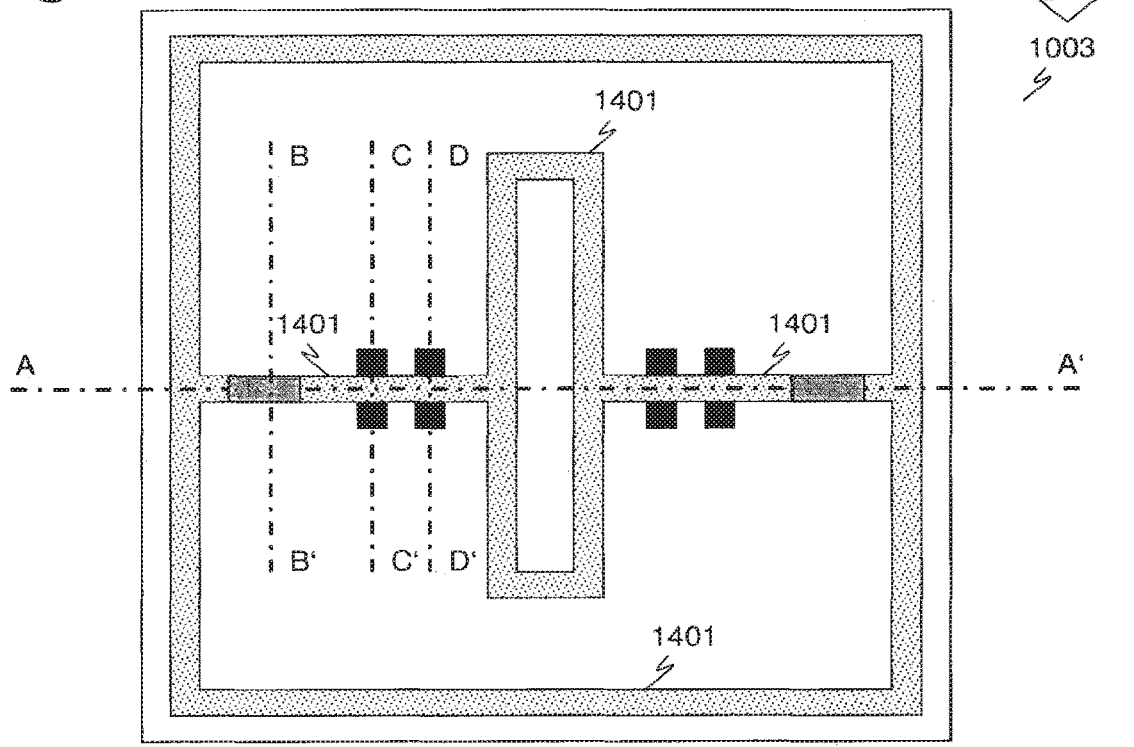
Figure 4:
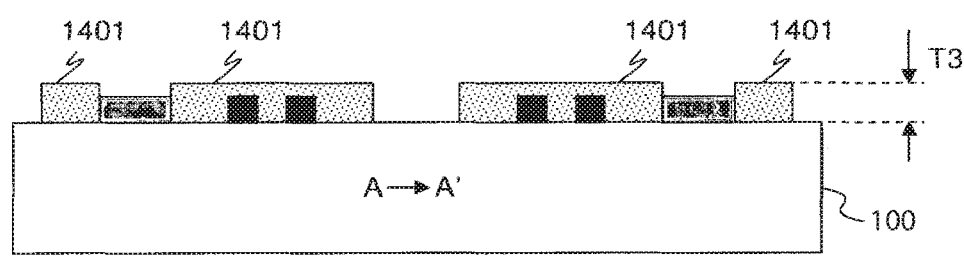
Figure 4:
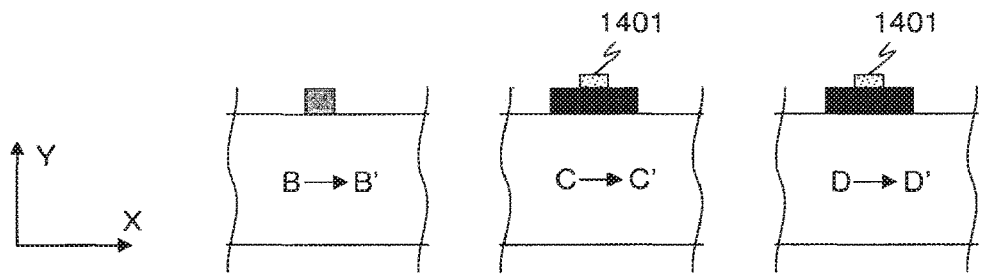

As can be seen in FIG. 4, the process for realizing a wasted heat harvesting device 1000 further includes a deposition step S3 of depositing a ferromagnetic seed material on a substrate 100, thereby obtaining intermediate wasted heat harvesting device 1003. This deposition of the ferromagnetic material results in ferromagnetic seed layer 1401.

More specifically, FIG. 4 represents, from top to bottom, a top view of substrate 100, a section view of substrate 100 along the line A-A', and three section views of substrate 100 along the lines B-B', C-C' and D-D'.

The purpose of the ferromagnetic seed layer 1401 is to realize a base for the subsequent quicker deposition of a ferromagnetic thick layer 1402.

As can be seen in the section view along line A-A', the deposited ferromagnetic layer could have a thickness T3 in the range of 100 μm to 200 μm, with a preferred value of 150 μm. The material could be any of iron type, ferromagnetic alloy, such as Fe or Fe—P or FeSi or Ni/Fe 45/55. The advantage of such material is that it has excellent ferromagnetic performance.

In the particular example of FIG. 4, the position of the ferromagnetic seed layer 1401 in the present embodiment consists of an outer circle close to the peripheral substrate 100, an inner circle and two connecting arms between the inner and outer circles. However, the present invention is not limited to this and more examples will be provided below. Generally speaking, the ferromagnetic material should be deposited so that it can be connected at least on one side to the subsequently deposited magnet and so that it can be connected on at least one side to the magnetic switch alloy. In this embodiment, as can be seen in the section taken along line A-A', the ferromagnetic seed layer 1401 is deposited on a region overlapping first and second coil segments 1301 and 1302 but not in a region overlapping switch 1200.

Figure 5:
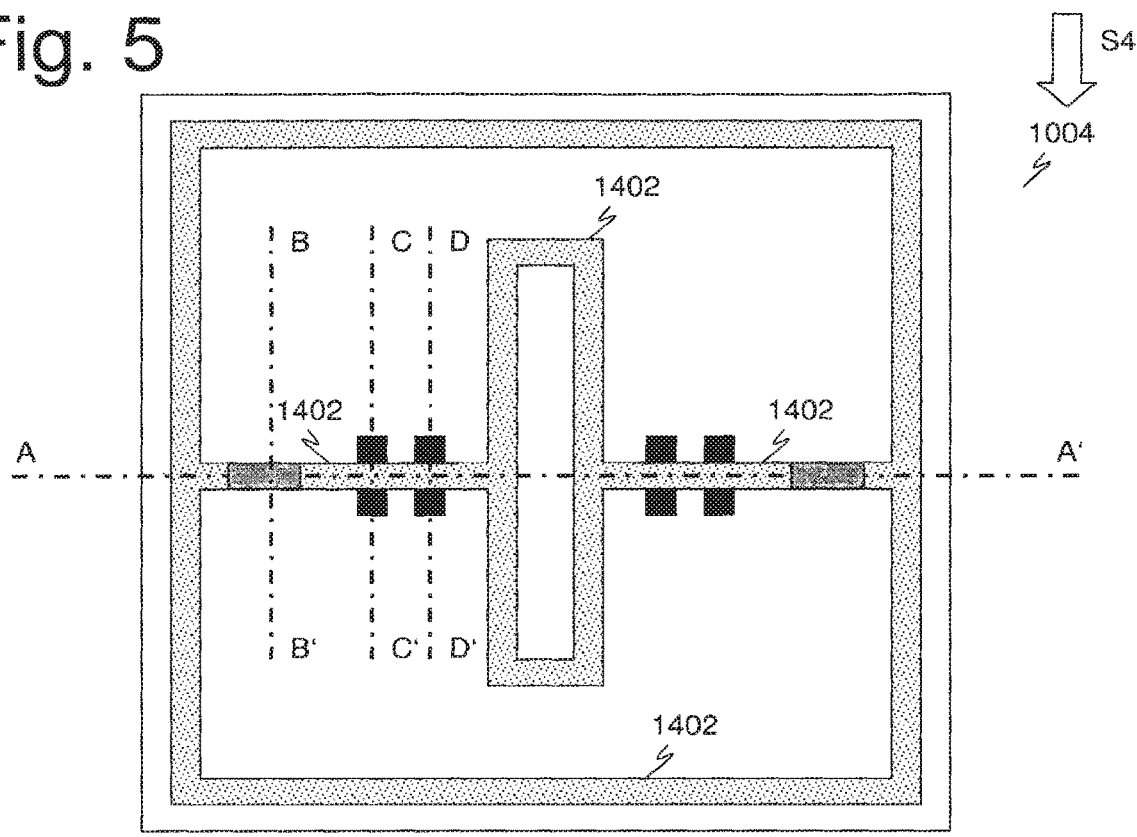
Figure 5:
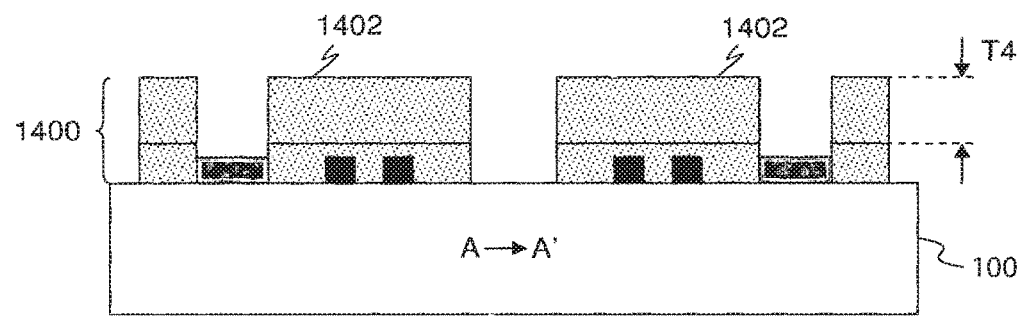
Figure 5:
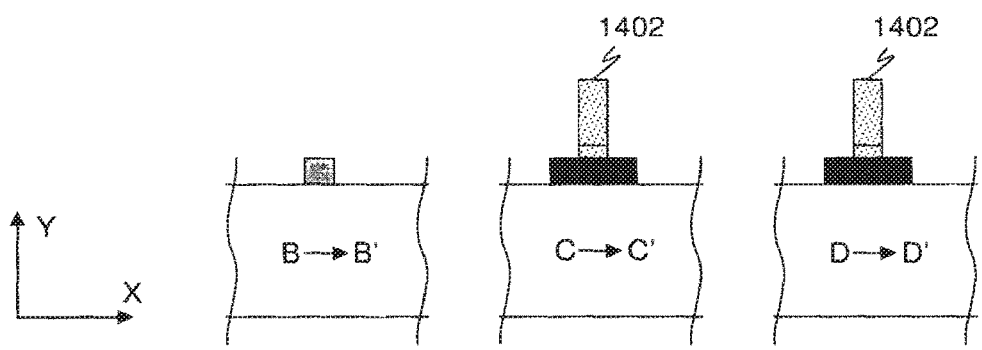

As can be seen in FIG. 5, the process for realizing a wasted heat harvesting device 1000 further includes a deposition step S4 of depositing a ferromagnetic material on a substrate 100, thereby obtaining intermediate wasted heat harvesting device 1004. This deposition of the ferromagnetic material results in ferromagnetic thick layer 1402.

More specifically, FIG. 5 represents, from top to bottom, a top view of substrate 100, a section view of substrate 100 along the line A-A', and three section views of substrate 100 along the lines B-B', C-C' and D-D'.

The ferromagnetic thick layer 1402 is deposited over ferromagnetic seed layer 1401. The combination of the two layers results in ferromagnet 1400.

As can be seen in the section view along line A-A', the deposited ferromagnetic layer could have a thickness T4 in the range of 100 μm to 200 μm, with a preferred value of 150 μm. The metal could be the same as the ferromagnetic seed layer 1401, or a different one. The advantage of using a different material is that a ferromagnetic seed could be chosen so as to secure good mechanical and thermal contact to the cell backside surface.

Although FIGS. 4 and 5 and steps S3 and S4 have been defined in order to realize a ferromagnet 1400, the ferromagnet 1400 could be realized in a single deposition step or in more than two deposition steps. The advantage of using more than one deposition step is that seed layer deposition may secure a better mechanical and thermal contact compared to a single step process.

Figure 6:
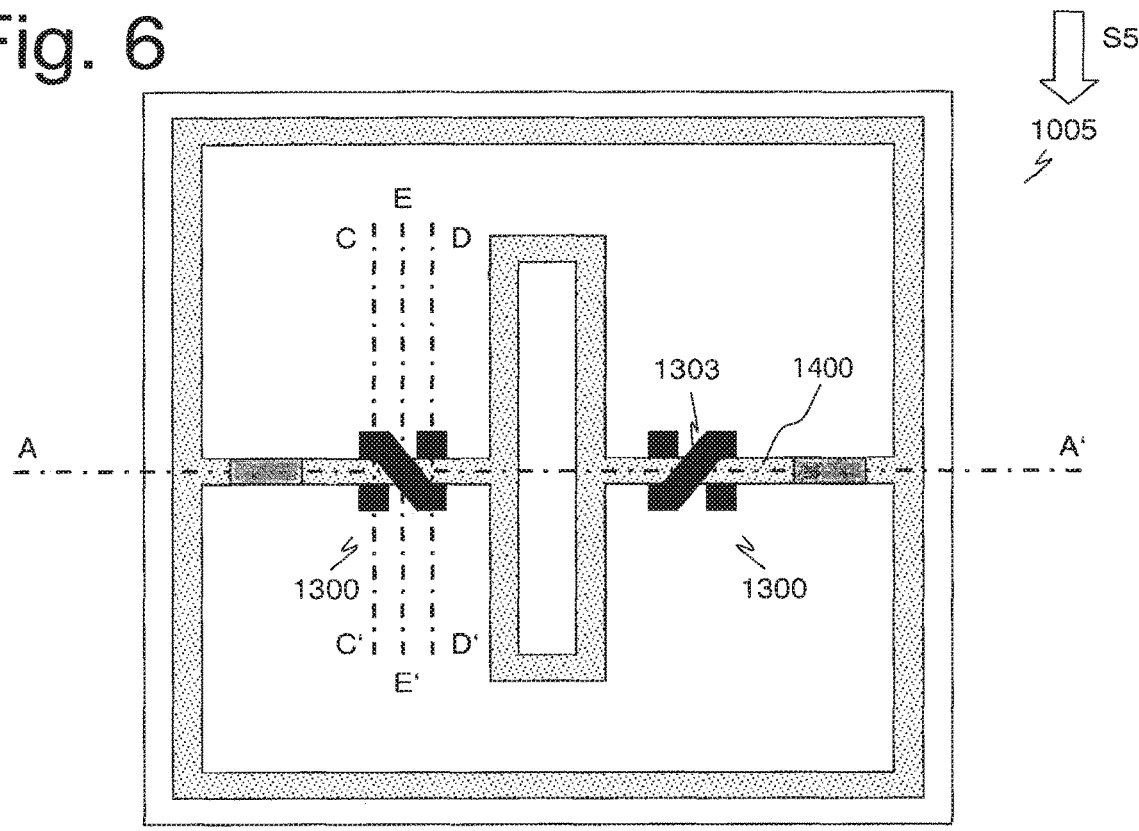
Figure 6:
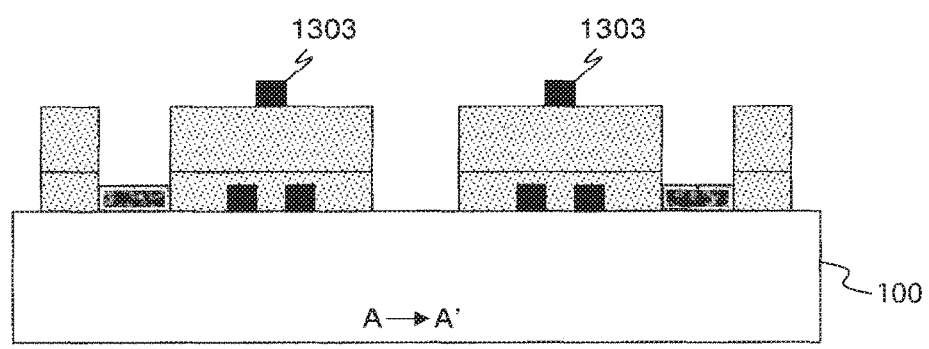
Figure 6:
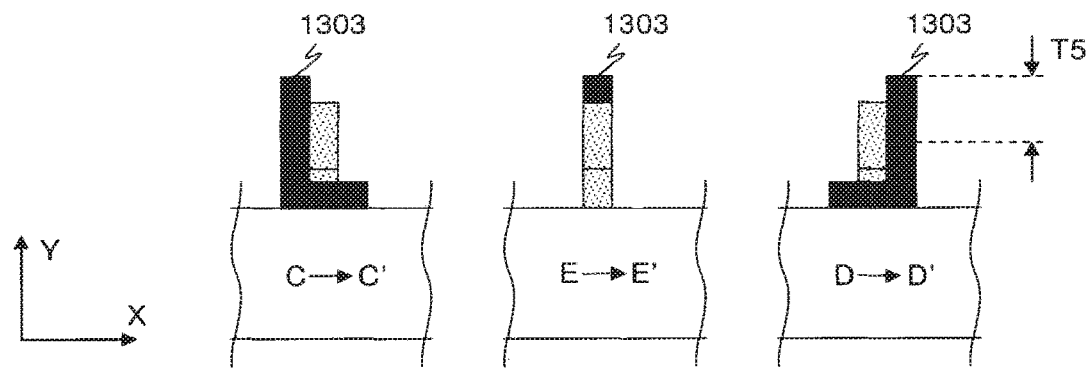

As can be seen in FIG. 6, a process for realizing a wasted heat harvesting device 1000 includes a deposition step S5 of depositing a metal layer on a substrate 100, thereby obtaining intermediate wasted heat harvesting device 1005. The deposition of the metal layer results in a third coil segment 1303.

More specifically, FIG. 6 represents, from top to bottom, a top view of substrate 100, a section view of substrate 100 along the line A-A', and three section views of substrate 100 along the lines C-C', E-E' and D-D'.

As can be seen in the section view along line D-D', the deposited metal layer could have a thickness T5 in the range of 100 µm to 200 µm, with a preferred value of 150 µm. The metal could be the same one used for first and second coil segments 1301 and 1302 (FIG. 2).

Third coil segment 1303 is deposited so that it creates a connection between one end of first coil segment 1301 and an end of second coil segment 1302. In this manner, a coil structure 1300 wound around ferromagnet 1400 is achieved.

Figure 7:
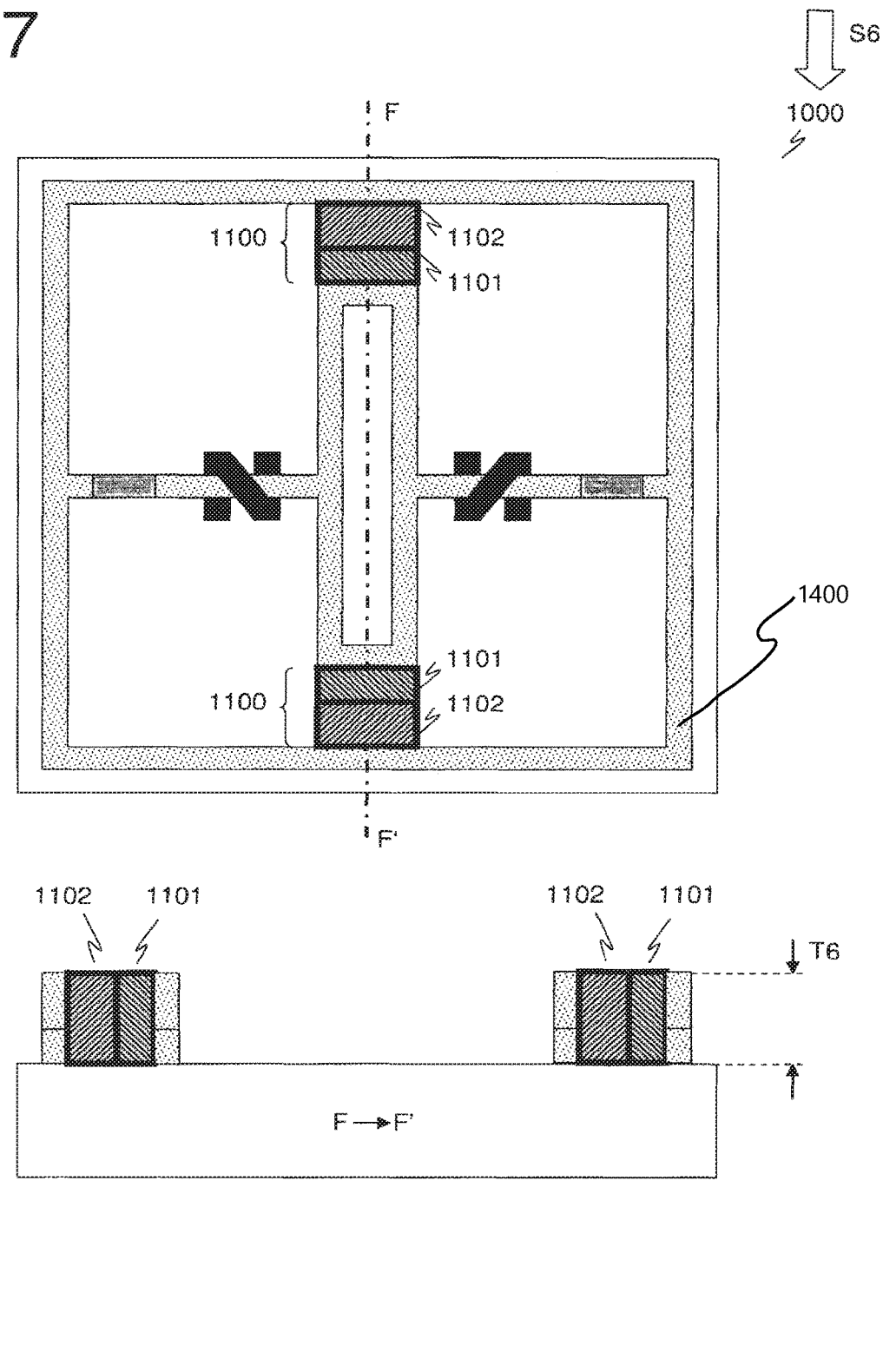

As can be seen in FIG. 7, the process for realizing a wasted heat harvesting device 1000 further includes a deposition step S6 of depositing a magnetic material on a substrate 100, thereby obtaining wasted heat harvesting device 1000. This deposition of the magnetic material results in magnet 1100. Alternatively or in addition, the magnet 1100 can be realized through deposition or assembly of a finished permanent magnet. The deposition may require an activation of the magnet 1100 through annealing and magnetization.

More specifically, FIG. 7 represents, from top to bottom, a top view of substrate 100 and a section view of substrate 100 along the line F-F'.

As can be seen in the section view along line F-F', the deposited magnetic layer could have a thickness T6 in the range of 100 µm to 300 µm, with a preferred value of 200 µm. The magnetic material could be any of $SmCo_5$, $Sm_2Co_{15}$, $Nd_2Fe_{14}B$ or Ba ferritis. The advantage of such materials is that they are all very strong permanent magnet materials.

In the particular example of FIG. 7, the position of the magnet 1100 in the present embodiment is between the outer circle of ferromagnetic material 1400, close to the peripheral substrate 100 and the inner circle of ferromagnetic material 1400. However, the present invention is not limited to this, and more examples will be provided below. Generally speaking, the magnet should be deposited so that it can be connected at least on one side to the ferromagnetic material 1400 and on the other side to the ferromagnetic material 1400 or to the switch 1200.

Although in the above examples the thicknesses T1, T2, T3, T4, T5 and T6 have been pictured as being different, the present invention is not limited by this graphical representation, which has only been employed so as to clarify the various thicknesses. More specifically, the thicknesses could all be the same, or some of them could be the same.

Although in the above examples the term "deposition" has been employed for the steps S1, S2, S3, S4, S5 and S6, this term is to be intended in the general meaning of realizing a layer. Accordingly, in order to deposit the described layers, a CVD, PVD, plasma deposition, nanoprinting, screen printing, or any other deposition technique could be used.

The deposition of any of the layers could be followed by one or more annealing steps.

Figure 8A:
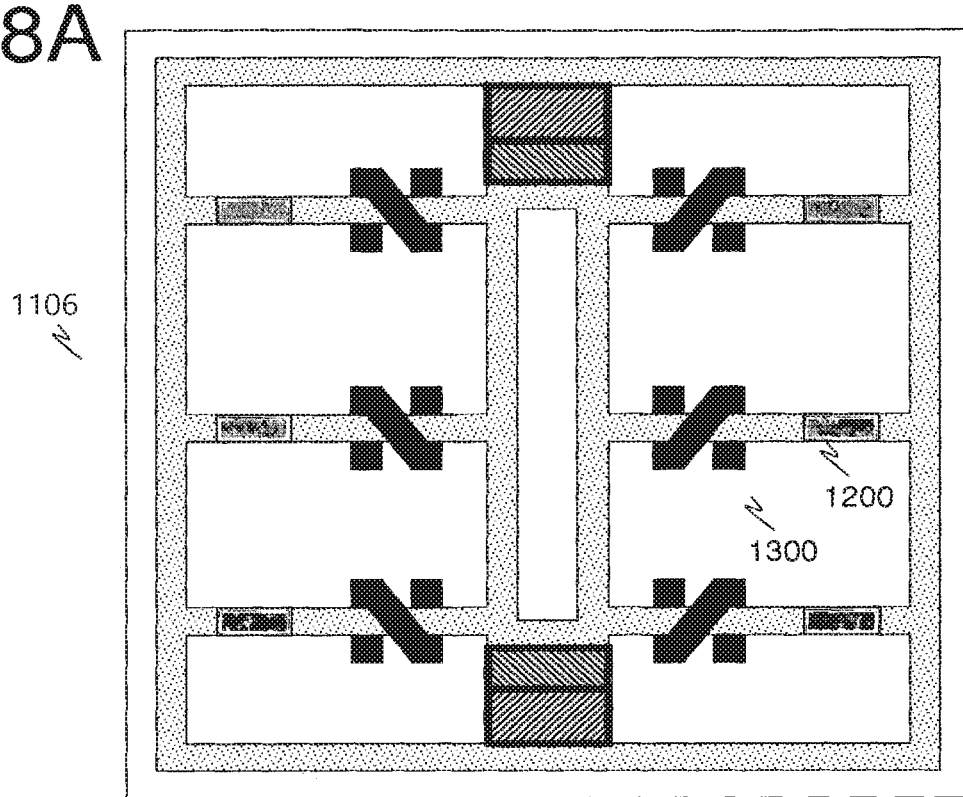
FIGS. 8A and 8B are schematic drawings of a wasted heat harvesting device according to further embodiments of the present invention.
Figure 8B:
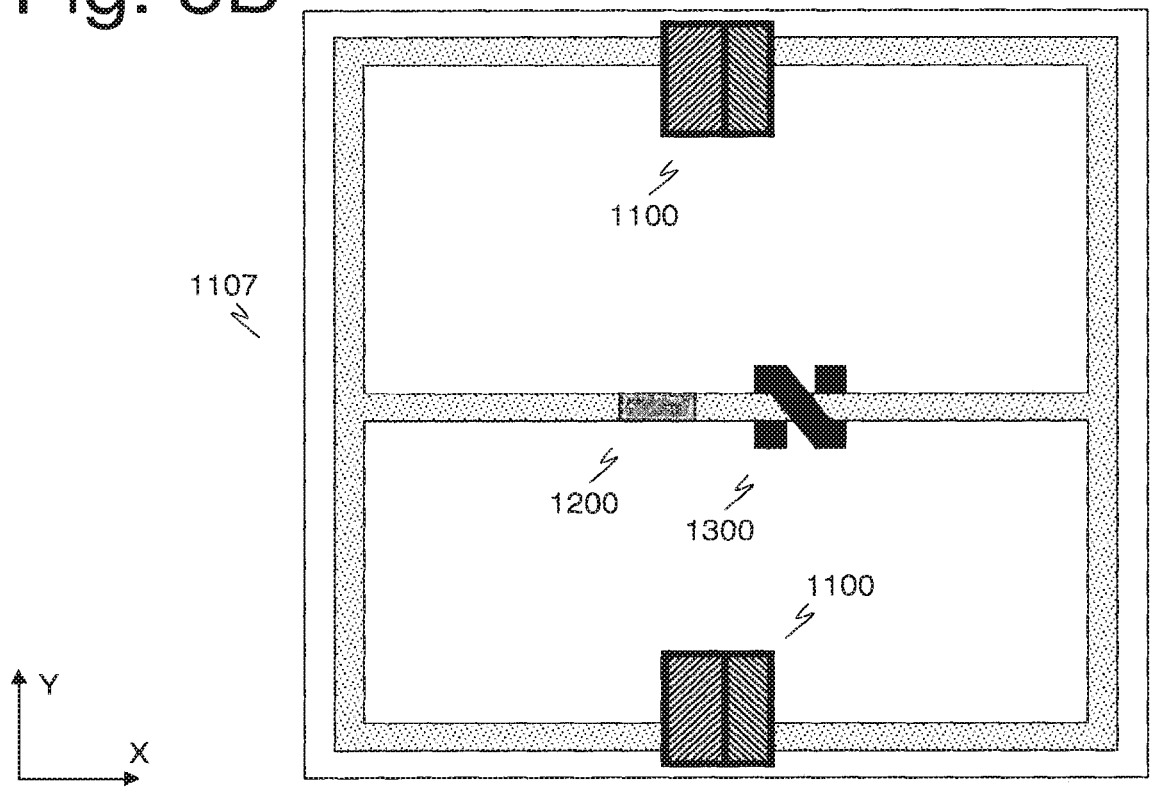

FIGS. 8A and 8B represent alternative embodiments of wasted heat harvesting devices 1106 and 1107. More generally, any physical implementation of the wasted heat harvesting device 1000 according to FIG. 1A can be realized.

In general, a typical size of the wasted heat harvesting devices 1000, 1106 and 1107 is in the range of 5.5 mm by 5.5 mm. This is the typical cell size used in the terrestrial CPV cell industry.

Figure 9A:
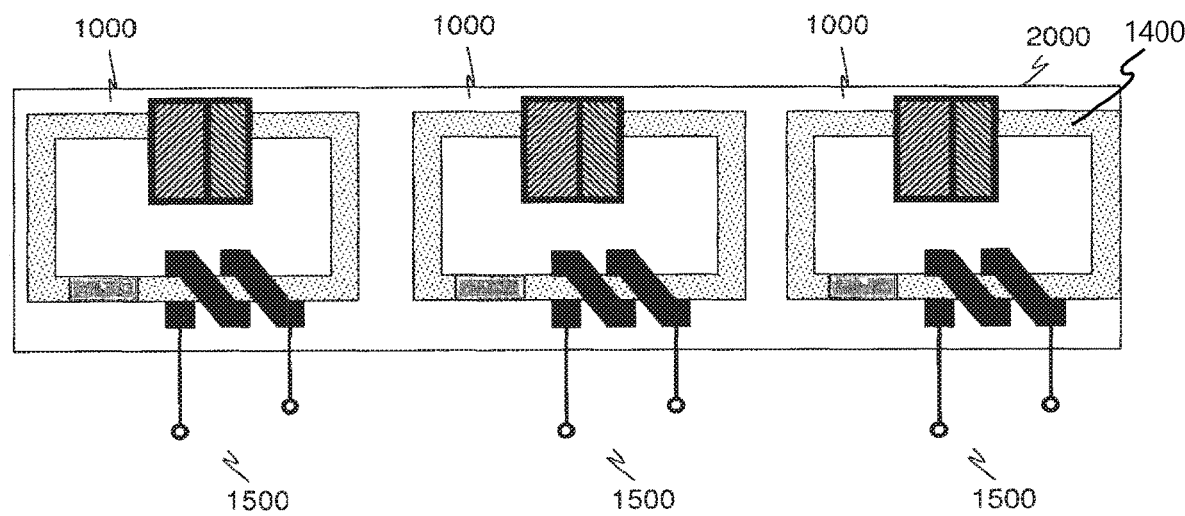
FIG. 9A is a schematic drawing of a wasted heat harvesting system in accordance with a further embodiment of the present invention.

FIG. 9A illustrates a wasted heat harvesting system 2000 according to a further embodiment of the present invention. The wasted heat harvesting system 2000 could be attached to the backside of a CPV cell. In the case that the CPV cell is realized on a germanium substrate, the wasted heat harvesting system 2000 could be realized or applied on the underside of the germanium substrate before or after the realization of the CPV cell.

The wasted heat harvesting system 2000 includes a plurality of wasted heat harvesting devices 1000. Each wasted heat harvesting device 1000 includes at least magnet 1100, ferromagnetic material 1400, switch 1200 and coil 1300. The power output 1500 of the coil 1300 of each of the wasted heat harvesting devices 1000 produces AC current. Accordingly, when a plurality of wasted heat harvesting devices 1000 is to be connected together on a wasted heat harvesting system 2000, different options are available.

For instance, the multiple power outputs 1500 could all be connected to each other in series, in parallel or in groups of parallel and series connections. In the following, four embodiments of the present invention will be described in which the connections of the multiple power outputs 1500 within a wasted heat harvesting system 2000 are described in conjunction with the connections of multiple power outputs 2500 of a plurality of wasted heat harvesting systems 2000.

Figure 9B:
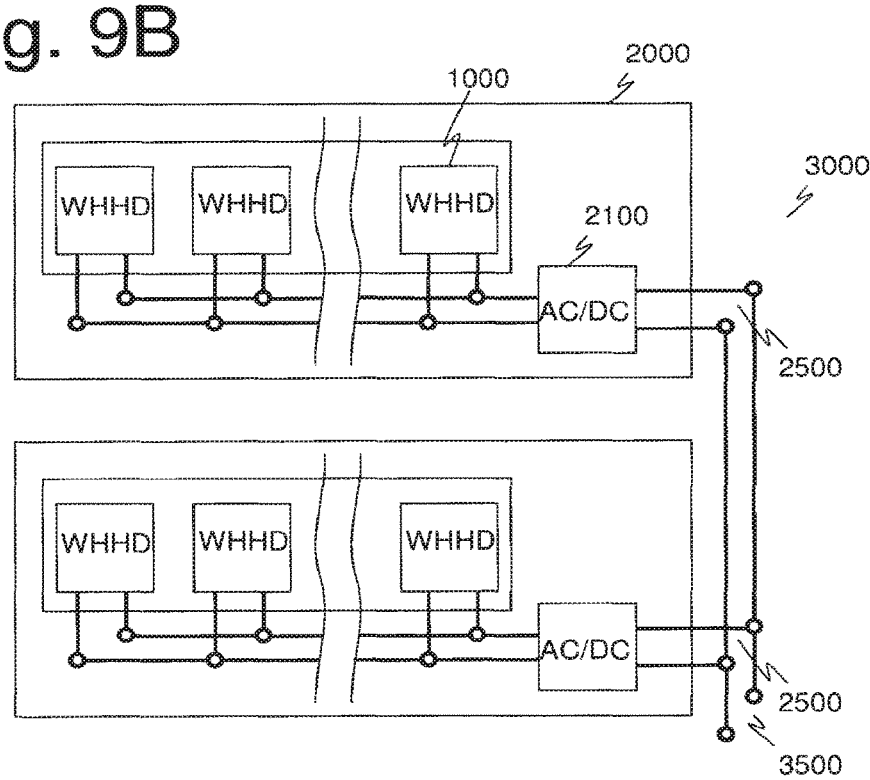
FIGS. 9B, 10A, 10B, and 11 are schematic drawings of modular wasted heat harvesting systems in accordance with further embodiments of the present invention.

FIG. 9B illustrates a modular wasted heat harvesting system 3000 composed by two wasted heat harvesting systems 2000, each having a power output 2500. Each of the two wasted heat harvesting systems 2000 includes a plurality of wasted heat harvesting devices 1000, each having a power output 1500.

In FIG. 9B, the multiple power outputs 1500 are connected in parallel to each other and this parallel connection is input into AC/DC converter 2100. In this manner, a wasted heat harvesting system 2000 would output a DC current on the power output 2500. In this case, it is assumed that the different wasted heat harvesting devices 1000 of the wasted heat harvesting system 2000 are operating with the same frequency. This might be the case if the wasted heat harvesting devices are, for instance, in close proximity to each other.

Additionally, a second wasted heat harvesting system 2000 is realized in the same manner as described above. The two power outputs 2500 of the two wasted heat harvesting systems 2000 are connected to each other in parallel so as to realize a modular wasted heat harvesting system 3000. This may be used in the case where the two wasted heat harvesting systems 2000 are placed in different regions having different temperatures, which would cause the operation of the plurality of wasted heat harvesting devices 1000 in each of the wasted heat harvesting systems 2000 to not be in phase with the remaining wasted heat harvesting devices.

Although the power outputs 1500 of the multiple wasted heat harvesting devices 1000 of each of the two wasted heat harvesting systems 2000 are illustrated as being connected in parallel to each other, they might be connected in series instead.

Similarly, although the power outputs 2500 of the two wasted heat harvesting systems 2000 are illustrated as being connected in parallel to each other, they might be connected in series instead.

Figure 10A:
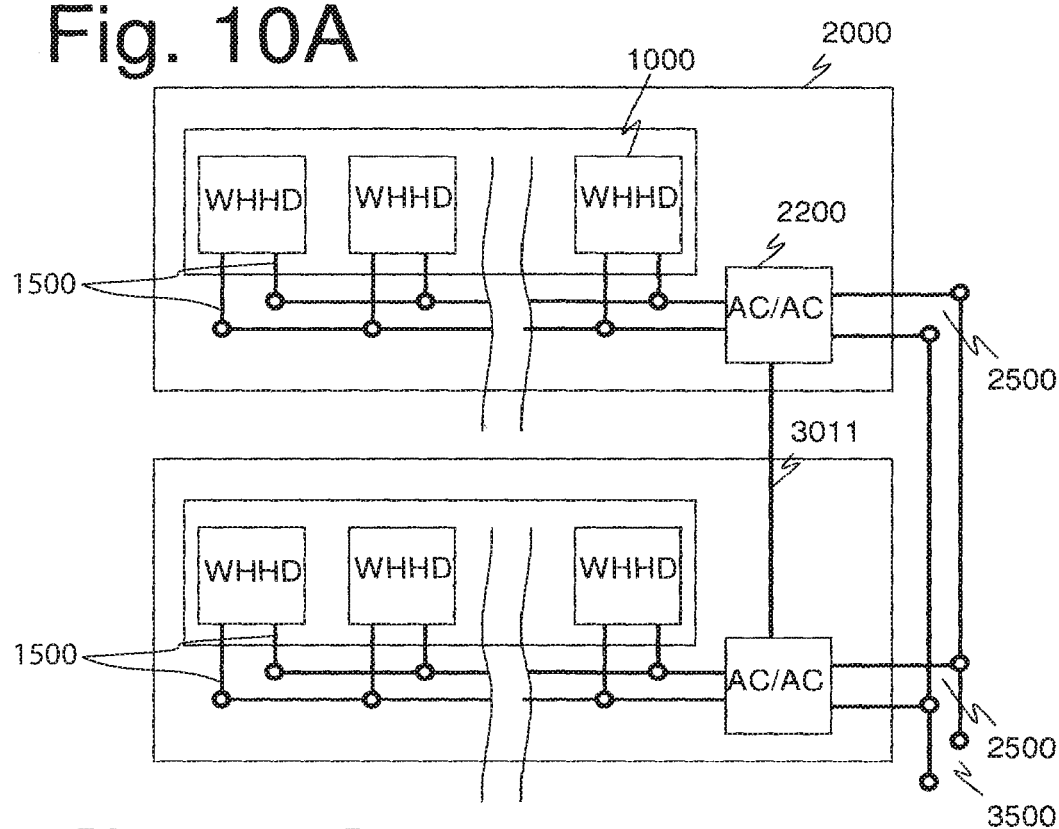

In FIG. 10A, the multiple power outputs 1500 are connected in parallel to each other and this parallel connection is input into AC/AC converter 2200. In this manner, a wasted heat harvesting system 2000 would output an AC current on the power output 2500. In this case, it is assumed that the different wasted heat harvesting devices 1000 of the wasted heat harvesting system 2000 are operating with the same frequency. This might be the case if the wasted heat harvesting devices are, for instance, in close proximity to each other.

Additionally, a second wasted heat harvesting system 2000 is realized in the same manner as described above. The two power outputs 2500 of the two wasted heat harvesting systems 2000 are connected to each other in parallel so as to realize a modular wasted heat harvesting system 3000 (FIG. 9B). This may be used in the case where the two wasted heat harvesting systems 2000 are placed in different regions having different temperatures, which would cause the operation of the plurality of wasted heat harvesting devices 1000 in each of the wasted heat harvesting systems 2000 to not be in phase with the remaining wasted heat harvesting devices. In this case, if the frequency of operation of the two wasted heat harvesting systems 2000 is not the same, the frequency of the AC current being output at power outputs 2500 can be aligned, via a connection 3011 between the AC/AC converters 2200. In this manner, the operation of the wasted heat harvesting systems 2000 can be phased, so as to provide a stable output 3500 of modular wasted heat harvesting systems 3010.

Figure 10B:
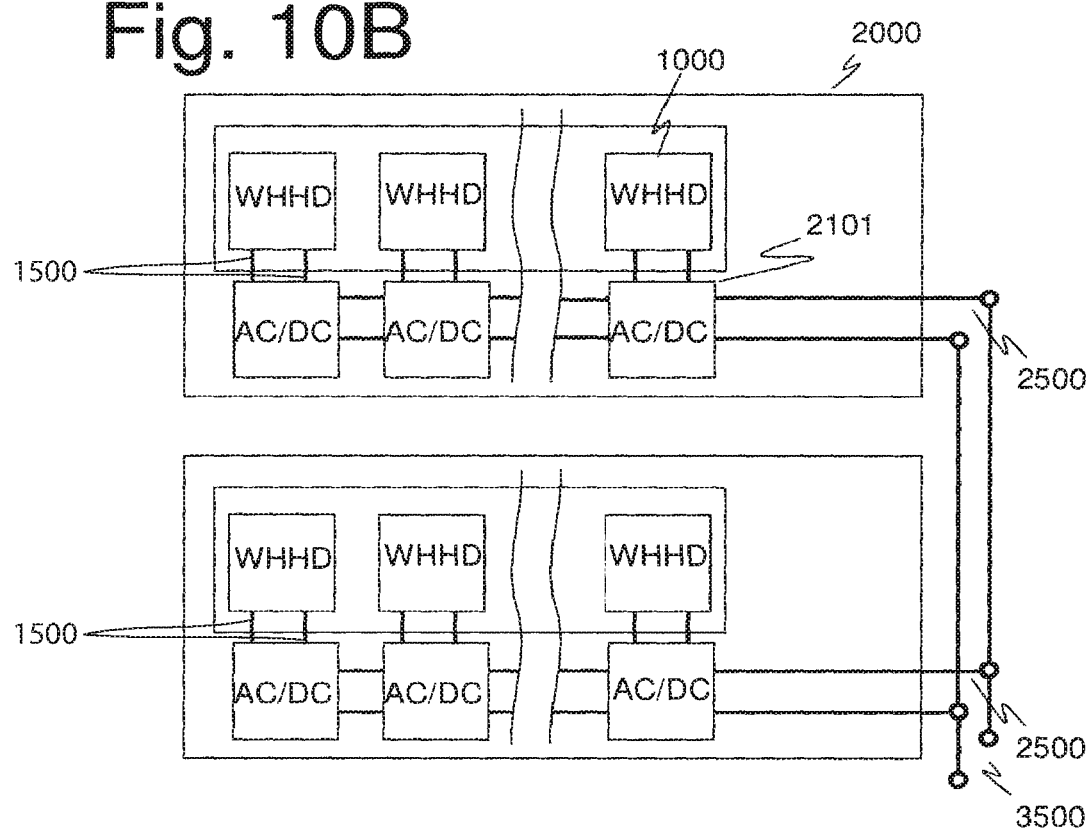

In FIG. 10B, a modular wasted heat harvesting system 3020 is illustrated, wherein each of the multiple power outputs 1500 is connected to an AC/DC converter 2101. In this manner, a wasted heat harvesting system 2000 would output a DC current on the power output 2500. In this case, it is assumed that the different wasted heat harvesting devices 1000 of the wasted heat harvesting system 2000 are not operating with the same frequency.

Figure 11:
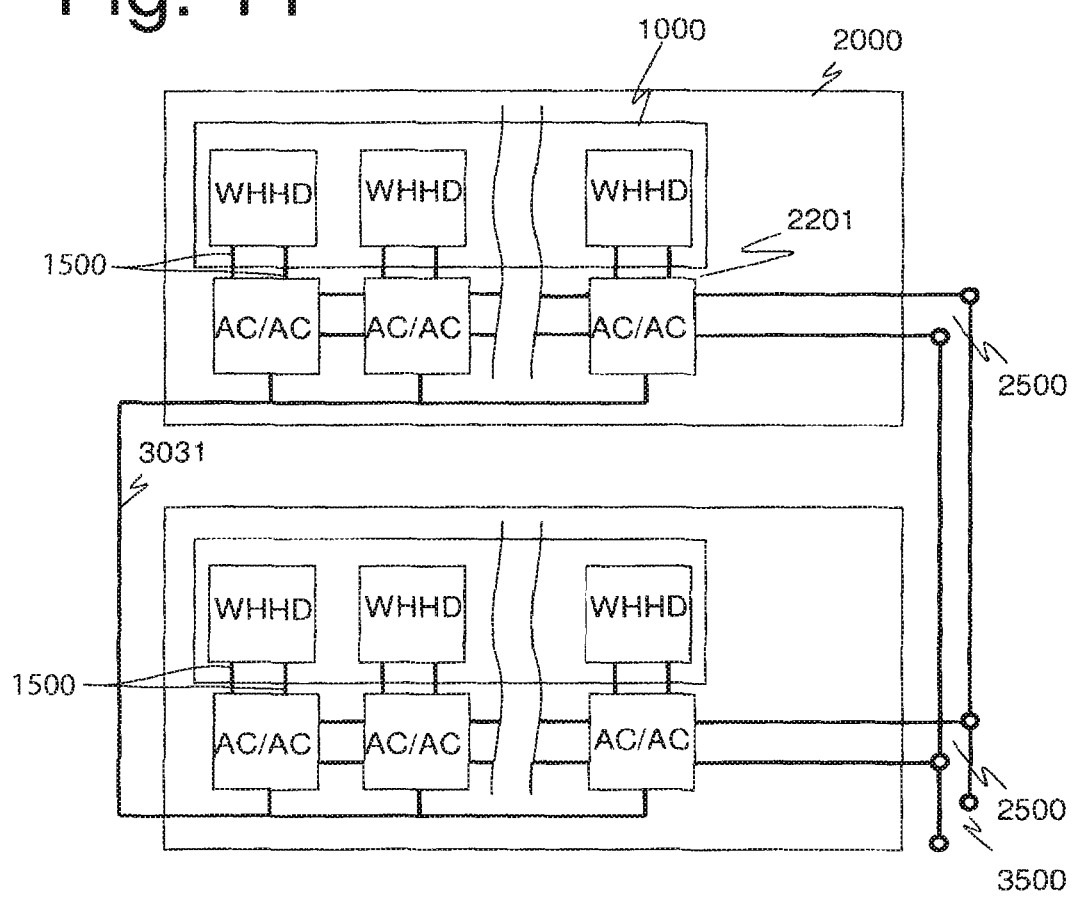

In FIG. 11, each of the multiple power outputs 1500 is connected to an AC/AC converter 2201. In this manner, a wasted heat harvesting system 2000 would output an AC current on the power output 2500. In this case, it is assumed that the different wasted heat harvesting devices 1000 of the wasted heat harvesting system 2000 are not operating with the same frequency. In order to guarantee an efficient combination of the multiple AC currents being generated, a phase information is shared among the plurality of AC/AC converters 2201 via connection 3031.

Any combination of the wasted heat harvesting device 1000, wasted heat harvesting system 2000, and modular wasted heat harvesting system 3000, can be mounted on the back surface of a CPV cell, or, more generally, a PV cell. For instance, it could be mounted directly on the cell. Alternatively, or in addition, it could be mounted onto a heat-sink.

Still alternatively, or in addition, any combination of the wasted heat harvesting device 1000, wasted heat harvesting system 2000, and modular wasted heat harvesting system 3000, could be realized directly on the back of the PV or CPV cell.

Although the present invention has been described with reference to the cooling of a concentrated photovoltaic cell, the present invention is not limited to this and could be used for cooling of any semiconductor substrate.

Still in addition, the present invention could be realized on a thin film, either semiconductor, metallic, or plastic, or any other material, and could be employed as an active cooling capable of generating current through the wasted heat in an application other than semiconductors, for instance, for powering engine management systems, or any surfaces exposed to the sun, like black painted surfaces, or motor engines, for instance, in cars, etc.

While the above was described with respect to one or more various embodiments, a person skilled in the art will appreciate the features described herein with respect to one or more embodiments that can be combined together without departing from the scope of the present invention as defined by the claims.

What is claimed is:

1. A photovoltaic cell including at least one wasted heat harvesting device including a switching device configured to convey a magnetic field from a first region to at least a second region when a temperature of the switching device crosses a predetermined temperature, and further including:
   a magnetic device configured to generate the magnetic field;
   a magnetic flux conveyor configured to convey a magnetic flux generated by switching of the switching device between an open state and a closed state; and
   an electricity-generating device configured to generate electricity from the magnetic flux;
   wherein the switching device is configured to convey the magnetic field from the first region outside the electricity-generating device to at least the second region inside the electricity-generating device;
   wherein the switching device remains in contact with the magnetic flux conveyor in both the open state and the closed state.

2. The photovoltaic cell of claim 1, wherein the switching device is a magnetic alloy switch.

3. The photovoltaic cell of claim 1, wherein a first side of the magnetic flux conveyor is connected to one pole of the magnetic device and the switching device is located between a second side of the magnetic flux conveyor and another pole of the magnetic device.

4. The photovoltaic cell of claim 1, wherein the electricity-generating device includes a coil wound around the magnetic flux conveyor.

5. The photovoltaic cell of claim 1, wherein the magnetic flux conveyor comprises at least one material selected from the group consisting of iron and a ferromagnetic alloy.

6. The photovoltaic cell of claim 1, wherein the magnetic device comprises at least one material selected from the group consisting of $SmCo_5$, $Sm_2Co_{15}$, $Nd_2Fe_{14}B$ and Ba ferrite.

7. The photovoltaic cell of claim 1, wherein the switching device comprises $Gd_5(Si_xGe_{1-x})_4$.

8. The photovoltaic cell of claim 1, wherein the electricity-generating device is configured to generate an alternating current.

9. The photovoltaic cell of claim 1, wherein a dimension of the at least one wasted heat harvesting device is about 5 mm by about 5 mm.

10. A wasted heat harvesting system including the at least one wasted heat harvesting device of claim 1, wherein the at least one wasted heat harvesting device comprises at least two wasted heat harvesting devices, each of the at least two wasted heat harvesting devices further including a device power output for outputting electricity generated by the electricity-generating device.

11. The wasted heat harvesting system of claim 10, wherein the device power outputs of the at least two wasted heat harvesting devices are connected in parallel or in series.

12. The wasted heat harvesting system of claim 11, further comprising an AC/DC converter connected to the device power outputs, an output of the AC/DC converter connected to a power output of the wasted heat harvesting system.

13. The wasted heat harvesting system of claim 10, further comprising a first AC/DC converter connected to the device power output of one of the at least two wasted heat harvesting devices, and a second AC/DC converter connected to the device power output of another of the at least two wasted heat harvesting devices.

14. The wasted heat harvesting system of claim 13, wherein an output of the first AC/DC converter and an output of the second AC/DC converter are connected in series or in parallel, and a combined output of the first AC/DC converter and the second AC/DC converter is connected to a power output of the wasted heat harvesting system.

15. The wasted heat harvesting system of claim 10, wherein the at least two wasted heat harvesting devices are configured to operate out of phase.

16. The wasted heat harvesting system of claim 10, wherein one of the at least two wasted heat harvesting devices is configured to output electricity while another of the at least two wasted heat harvesting devices does not output electricity.

17. An energy harvesting system comprising:
at least one photovoltaic cell comprising:
  a photovoltaic comprising at least one surface; and
  at least one lens configured to focus light on the at least one surface of the photovoltaic; and
at least one wasted heat harvesting device in thermal contact with the at least one photovoltaic cell, the at least one wasted heat harvesting device comprising:
  a magnetic device configured to generate a magnetic field;
  a switching device configured to convey a magnetic field from a first region to at least a second region when a temperature of the switching device crosses a predetermined temperature;
  a magnetic flux conveyor configured to convey a magnetic flux generated by a switching of the switching device between an open state and a closed state; and
  an electricity-generating device configured to generate electricity from the magnetic flux;
  wherein the switching device is configured to convey the magnetic field from the first region outside the electricity-generating device to at least the second region inside the electricity-generating device; wherein the switching device remains in contact with the magnetic flux conveyor in both the open state and the closed state.

18. A method for forming a photovoltaic cell including at least one wasted heat harvesting device including a switching device configured to convey a magnetic field from a first region to at least a second region when a temperature of the switching device crosses a predetermined temperature, the method comprising:
  a first deposition step of depositing a first metal layer on a substrate;
  a second deposition step of depositing a first magnetic alloy on the substrate;
  a third deposition step of depositing a ferromagnetic seed material on the substrate;
  a fourth deposition step of depositing a second metal layer on the substrate; and
  a fifth deposition step of depositing a second magnetic material on the substrate;
  wherein the method further comprises forming the first metal layer, the first magnetic alloy, the ferromagnetic seed material, the second metal layer, and the second magnetic material to define the switching device, a magnetic flux conveyor, and an electricity-generating device of the at least one wasted heat harvesting device, the switching device configured to convey the magnetic field generated by a magnetic device from the first region outside the electricity-generating device to at least the second region inside the electricity-generating device when the temperature of the switching device crosses a predetermined temperature, the magnetic flux conveyor configured to convey a magnetic flux generated by switching of the switching device between an open state and a closed state, and the electricity-generating device configured to generate electricity from the magnetic flux; wherein the switching device remains in contact with the magnetic flux conveyor in both the open state and the closed state.

* * * * *

UNITED STATES PATENT AND TRADEMARK OFFICE
CERTIFICATE OF CORRECTION

PATENT NO. : 10,778,121 B2  
APPLICATION NO. : 15/897957  
DATED : September 15, 2020  
INVENTOR(S) : Rainer Krause and Bruno Ghyselen Page 1 of 1

It is certified that error appears in the above-identified patent and that said Letters Patent is hereby corrected as shown below:

In the Specification  
    Column 1, Line 11, change "Application PCT/I132012/001415," to --Application PCT/IB2012/001415,--

Signed and Sealed this  
Second Day of February, 2021

Drew Hirshfeld  
*Performing the Functions and Duties of the  
Under Secretary of Commerce for Intellectual Property and  
Director of the United States Patent and Trademark Office*